United States Patent
Sadana et al.

(10) Patent No.: US 11,677,039 B2
(45) Date of Patent: Jun. 13, 2023

(54) VERTICAL SILICON AND III-V PHOTOVOLTAICS INTEGRATION WITH SILICON ELECTRONICS

(71) Applicant: International Business Machines Corporation, Armonk, NY (US)

(72) Inventors: Devendra K. Sadana, Pleasantville, NY (US); Ning Li, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 17/530,446

(22) Filed: Nov. 18, 2021

(65) Prior Publication Data

US 2023/0155048 A1    May 18, 2023

(51) Int. Cl.
H01L 31/0725    (2012.01)
H01L 31/0352    (2006.01)
H01L 31/18      (2006.01)
H01L 31/075     (2012.01)

(52) U.S. Cl.
CPC .. H01L 31/0725 (2013.01); H01L 31/035263 (2013.01); H01L 31/075 (2013.01); H01L 31/1812 (2013.01); H01L 31/1856 (2013.01)

(58) Field of Classification Search
CPC ......... H01L 31/0725; H01L 31/035263; H01L 31/075; H01L 31/1812; H01L 31/1856
See application file for complete search history.

(56) References Cited

U.S. PATENT DOCUMENTS

| 7,863,650 | B2 | 1/2011 | Letertre |
| 7,972,875 | B2 | 7/2011 | Rogers |
| 8,679,888 | B2 | 3/2014 | Rogers |
| 10,374,120 | B2 | 8/2019 | Atwater, Jr. |
| 2008/0128745 | A1* | 6/2008 | Mastro ................. H01L 31/078 257/E31.128 |
| 2010/0116329 | A1 | 5/2010 | Fitzgerald |
| 2012/0152322 | A1 | 6/2012 | Kribus |

OTHER PUBLICATIONS

Chuqi Yi et al., "Application of polydimethylsiloxane surface texturing on III-V//Si tandem achieving more than 2% absolute efficiency improvement," Optics Express, vol. 28, No. 3, Jan. 28, 2020, pp. 3895-3904.
T. J. Grassman et al., "Control and elimination of nucleation-related defects in GaP/Si (001) heteroepitaxy," Applied Physics Letters, vol. 94, No. 23, Jun. 11, 2009, 232106, 3 pp.

* cited by examiner

*Primary Examiner* — Golam Mowla
(74) *Attorney, Agent, or Firm* — L. Jeffrey Kelly; Otterstedt & Kammer PLLC

(57) ABSTRACT

A photovoltaic structure includes a substrate; and a plurality of off-axis, doped silicon regions outward of the substrate. The plurality of off-axis, doped silicon regions have an off-axis lattice orientation at a predetermined non-zero angle. A plurality of photovoltaic devices of a first chemistry are located outward of the plurality of off-axis, doped silicon regions. Optionally, a plurality of photovoltaic devices of a second chemistry, different than the first chemistry, are located outward of the substrate and are spaced away from the plurality of off-axis, doped silicon regions.

16 Claims, 13 Drawing Sheets

VERTICAL SILICON AND III-V PHOTOVOLTAICS INTEGRATION WITH SILICON ELECTRONICS

BACKGROUND

The present invention relates generally to the electrical, electronic and computer arts and, more particularly, to photovoltaic devices.

Photovoltaics (PV) refers to conversion of light into electric current via semiconducting materials exhibiting the photovoltaic effect. For example, a solar cell converts the energy of light into electricity by the photovoltaic effect. Multi junction (MJ) solar cells have multiple p-n junctions made of different semiconductor materials. One example includes III-V materials (a III-V compound semiconductor is an alloy including elements from groups III and V in the periodic table). Certain current techniques require epitaxial growth on a silicon-on-insulator (SOI) substrate. Such growth is more complicated on an SOI substrate than on a conventional silicon substrate.

BRIEF SUMMARY

Principles of the invention provide techniques for vertical silicon and III-V photovoltaics integration with silicon electronics. In one aspect, an exemplary photovoltaic structure includes a substrate; a plurality of off-axis, doped silicon regions outward of the substrate, the plurality of off-axis, doped silicon regions having an off-axis lattice orientation at a predetermined non-zero angle; and a plurality of photovoltaic devices of a first chemistry, outward of the plurality of off-axis, doped silicon regions.

In another aspect, an exemplary method of forming a photovoltaic structure includes providing a substrate having an outer surface; direct wafer bonding, to the outer surface of the substrate, an off-axis silicon layer, having an off-axis lattice orientation at a predetermined non-zero angle; forming a plurality of off-axis, doped silicon regions in the off-axis silicon layer; and forming a plurality of photovoltaic devices of a first chemistry outward of the plurality of off-axis, doped silicon regions.

In still another aspect, another exemplary method of forming a photovoltaic structure includes providing a silicon substrate; forming an oxide layer outward of the silicon substrate and having an outer surface; direct wafer bonding a fabrication layer to the oxide layer; and forming a plurality of photovoltaic devices at least partially in the fabrication layer.

As used herein, "facilitating" an action includes performing the action, making the action easier, helping to carry the action out, or causing the action to be performed. Thus, by way of example and not limitation, instructions executing on one processor might facilitate an action carried out by integrated circuit fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:
simplified wafer handling, avoiding need for multiple complex double flipping/bonding/debonding processes;
avoid need for epitaxial growth of III-V materials on a conventional silicon-on-insulator (SOI) substrate;
improved yield.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

As noted, certain current techniques require epitaxial growth on a silicon-on-insulator (SOI) substrate, and such growth is more complicated on an SOI substrate than on a conventional silicon substrate. One or more embodiments advantageously provide techniques to build offcut (also referred to as off cut), highly doped, thick silicon (Si) layer and/or III-V layers, during the SOI wafer fabrication process, including building such wafers on a sapphire substrate for integration with Si and Gallium nitride (GaN).

Considerable difficulty would be encountered in integrating III-V material and Si without using certain aspects of the invention, including a complex double transfer involving glue, one or more handling layers, and irradiation to facilitate release.

Figure 1:
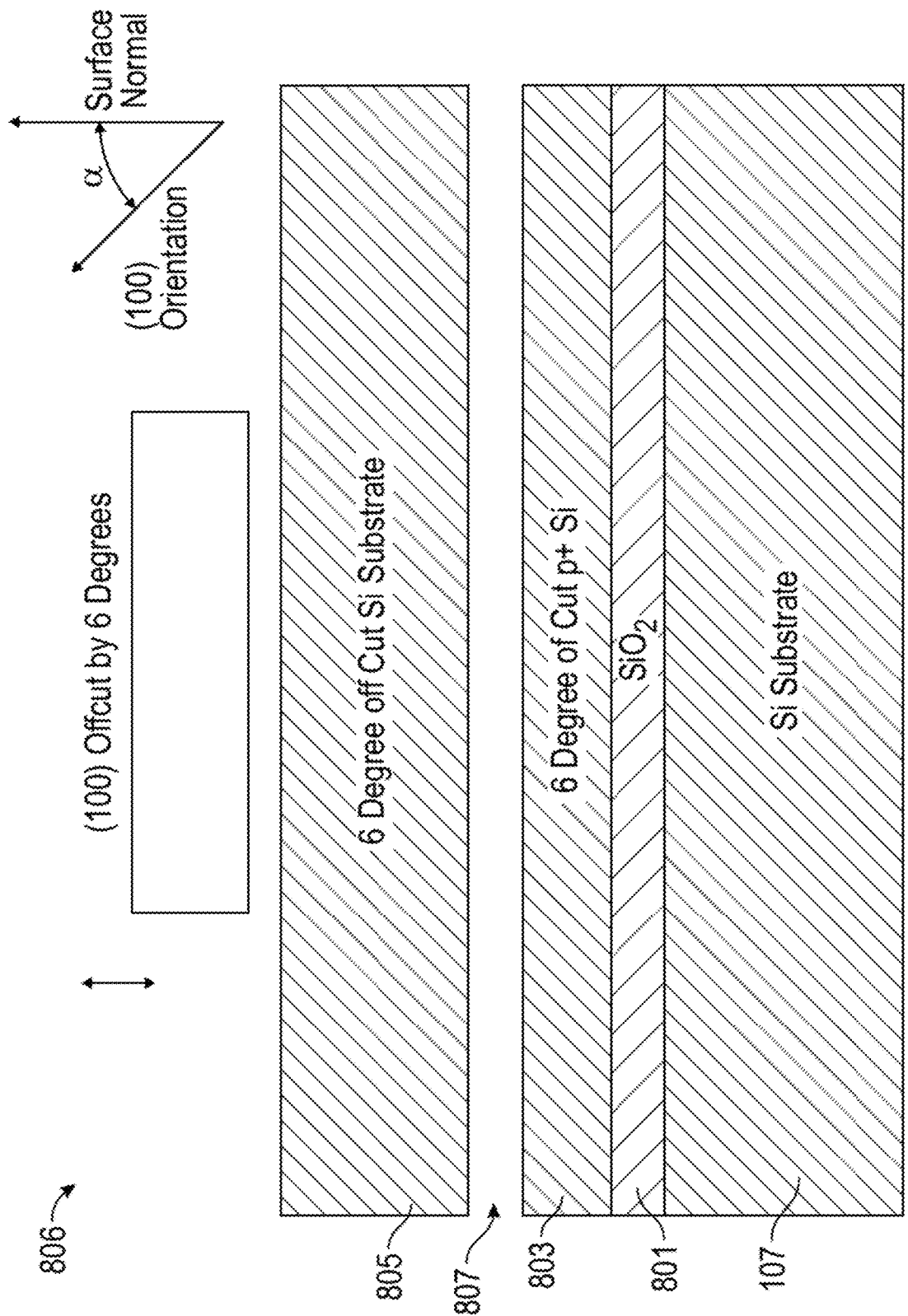
FIGS. 1-4 show exemplary steps in the fabrication of a first semiconductor structure, according to an aspect of the invention.

Referring now to FIG. 1, an exemplary approach to PV integration, according to an aspect of the invention, begins with an ordinary silicon substrate 107. In FIG. 1, layer 801 (e.g., $SiO_2$) is deposited on top of substrate 107 and provides a bonding interface to six degree off-cut p-doped Si 803. Direct wafer bonding, such as oxide-to-oxide bonding can be employed in one or more embodiments. Layer release 807 outward of the p-doped Si 803 represents a suitable wafer thinning process (a cutting process such as the Smart-Cut process discussed below is an example), which detaches six degree off-cut Si 805. It will be appreciated that elements 107, 801, and 803 in effect form an SOI structure. In one or more embodiments, instead of normal Si, use a 6 degree offcut portion (e.g., layer 803) as the SOI top layer. Furthermore regarding the offcut, suppose the crystal orientation is, say, (100); the offcut is tilted by an angle a selected to facilitate subsequent material growth (e.g., six degrees) as seen at 806 (generally representative of offcut as employed in several embodiments herein). Advantageously, it is easier to grow III-V material on top of the 6 degree off cut. An exemplary fabrication technique includes cutting an Si ingot on a shallow angle and polishing same. It will appear to be normal Si but the crystal orientation will be slightly tilted. In one or more embodiments, layers 803 and 805 are initially one piece and then they are cut. Gap (layer release 807) represents controlled breakage/air. In one or more embodiments, the doping of layer 805 is not relevant so long as layer 803 is doped in the desired manner. In one approach, layers 803 and 805 are initially a single piece with p+ doping, and then the cut is made at 807; i.e., 803 and 805 are both p+. In another approach, grow a p+ layer on the combined 803-805 piece, orient it towards the layer 801, and cut off layer 805 at 807. In this aspect, 803 is p+ while 805 is not necessarily p+. In still another approach, dope layer 803 after cutting layer 805 away at 807. In this aspect as well, 803 is p+ while 805 is not necessarily p+.

Direct wafer bonding refers to a wafer bonding process without any additional intermediate layers (no glue is used). The bonding process is based on chemical bonds between the two surfaces.

The above-mentioned SmartCut process involves the implantation of ions within a monocrystalline silicon wafer. The ions, typically hydrogen ions (H+), form a layer of microbubbles parallel to the wafer surface that later functions as a cleavage plane. The implanted wafer is fractured along the hydride-rich plane. In an exemplary embodiment, a microbubble layer (not shown) is formed within the substrate (803 and 805 together prior to cut) at a depth corresponding to the desired thickness of the layer 803 that later forms part of the solar cell. The layer to be cleaved using the SmartCut process or other suitable process can have, for example, a uniform thickness.

Figure 2:
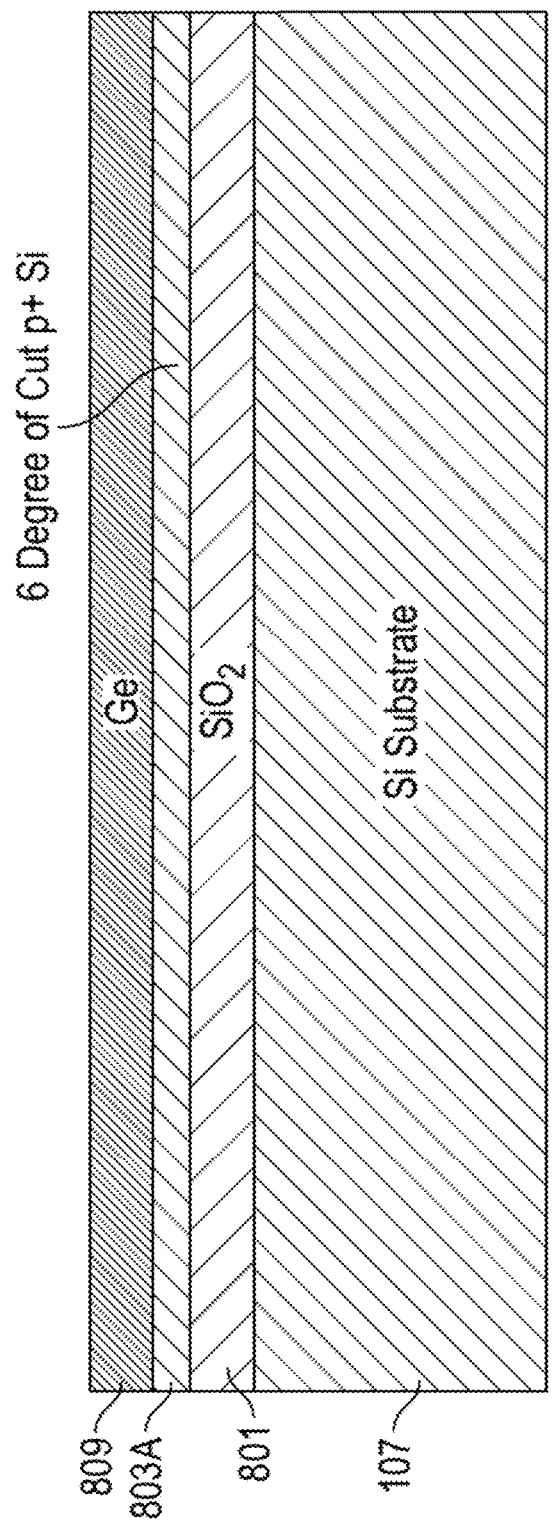
Figure 3:
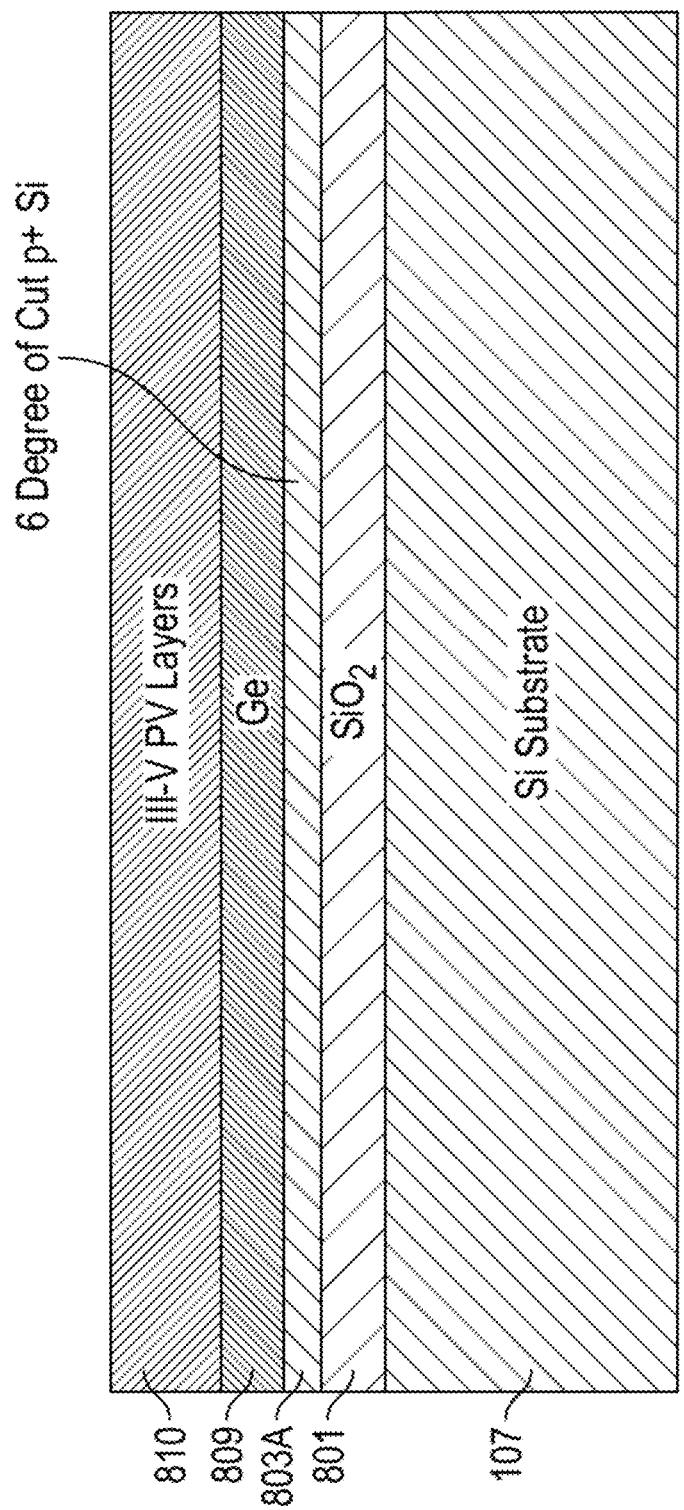

In FIG. 2, grow a Ge buffer layer (germanium region 809) outward of the p-doped off cut Si 803A. Layer 805 can be recycled. Layer 803 in FIG. 1 is optionally thinned in FIG. 2 and thus referred to as layer (offcut) 803A therein. Ge and III-V materials advantageously grow well on off cut 803A as compared to on regular Si. In FIG. 3, grow the III-V layers 810 for the III-V devices directly on the structure of FIG. 2 and then proceed with fabrication. Note that III-V layers 810 can include multiple layers to form one or more junctions; for example, three layers such as P-I-N or N-I-P, or more than 3 layers—possibly on the order of 10-15, for example.

Figure 4:
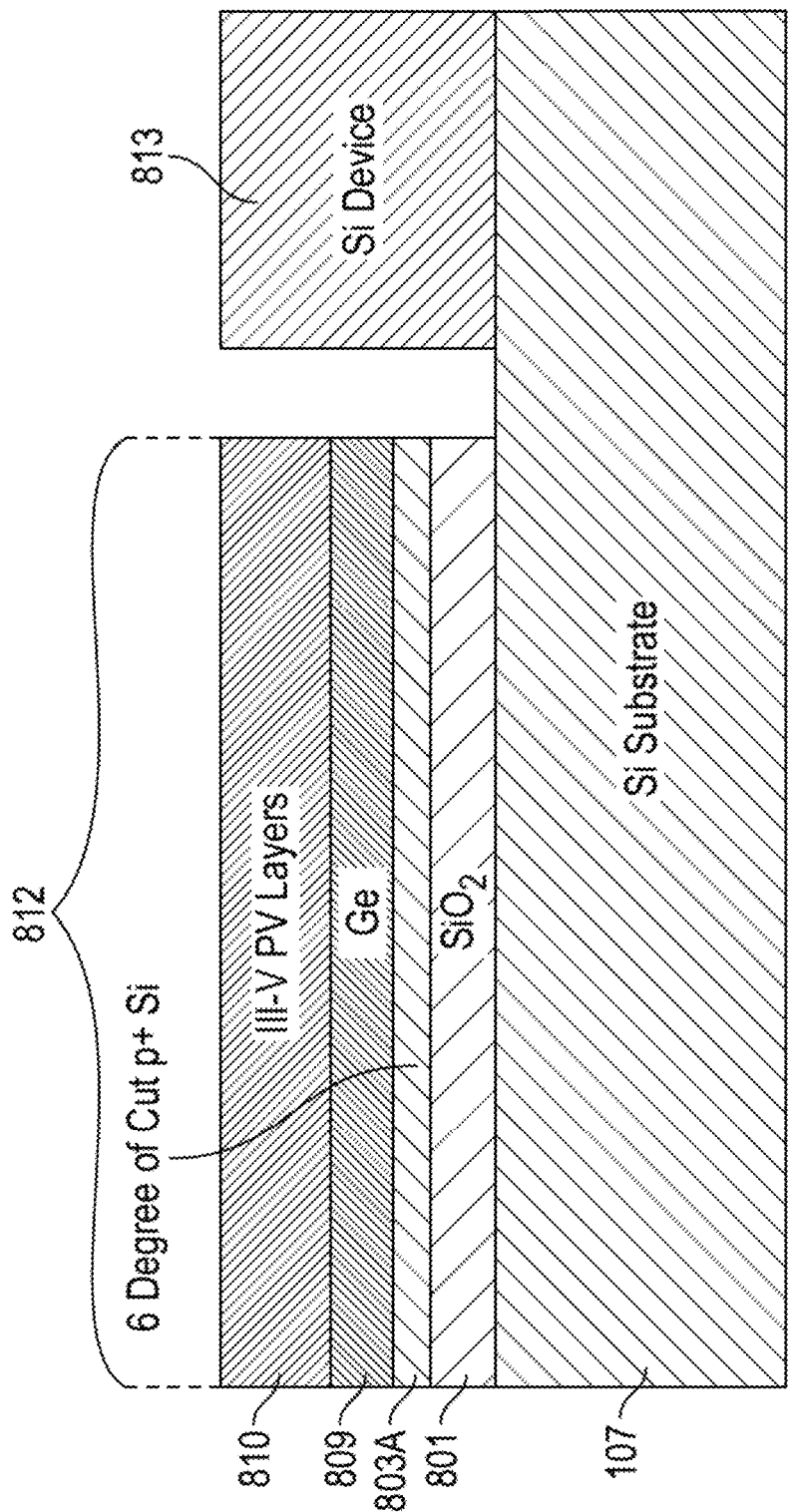

FIG. 4 shows an exemplary technique to directly fabricate the PV devices without bonding/debonding. Directly make mesa structures such as structure 812 on the SOI to provide insulation between the PV devices. From the structure shown in FIG. 3, known techniques of lithography, deposition, and etching can be used to obtain the result depicted in FIG. 4. Note the possibility of a separate silicon region which can be used for formation of Si-based PV device(s) 813. Thus, substrate 107 plus layer 801 (e.g., oxide) effectively form an SOI substrate and the 6 degree offcut 803A allows for growth of a wide range of materials.

Figure 5:
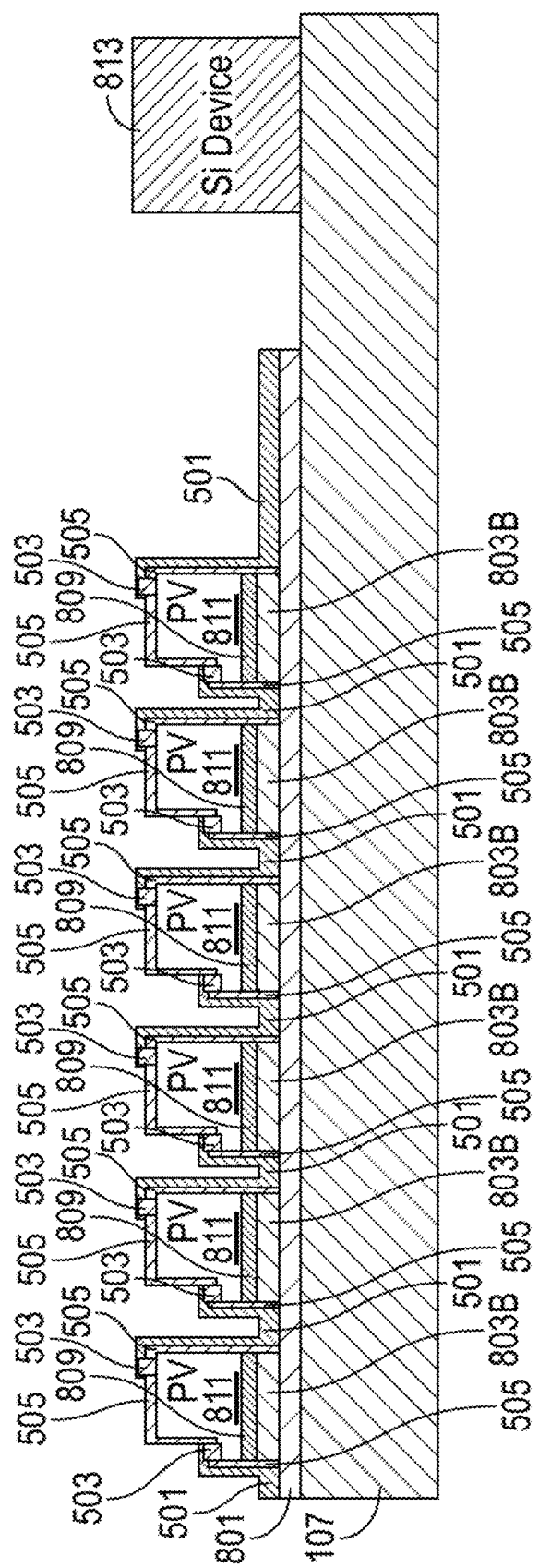
FIG. 5 shows the first semiconductor structure, fabricated using the step of FIGS. 1-4, according to an aspect of the invention.

Referring to the final structure depicted in FIG. 5, in one or more embodiments, PV devices 811 are epitaxially grown on top of the structure of FIG. 2. First grow III-V PV blanket layers 810 as seen in FIG. 3. Then pattern and etch same to obtain small mesas such as mesa 812 in FIG. 4. The III-V PV layer 810 becomes the devices 811, with intermediate processing steps that can be done using known techniques, as will be apparent to the skilled artisan, given the teachings herein. Note jumpers 501 placing the devices 811 in series, contacts 503, encapsulation/insulating material 505 and III-V PV devices 811. The p-doped silicon is designated as 803B in FIG. 5 because it has been further thinned. In a non-limiting example, a characteristic dimension of devices 811 can range from the order of 100 μm up to the order of mm or cm, for example. Note that external connections of jumpers 501 are omitted for clarity. Separate silicon devices 813 can include, for example, Si-based photocell devices. They can also be connected in series with suitable jumpers and external contacts, omitted to avoid clutter. Separate silicon devices 813 can be formed directly on Si substrate 107 with known lithographic, etching, deposition, and metallization techniques, for example. Note that in one or more embodiments, material 505 is clear/transparent to allow light to impinge on the photovoltaic devices. Examples of suitable materials include $Al_2O_3$, $SiO_2$, SiN, and the like.

Figure 6:
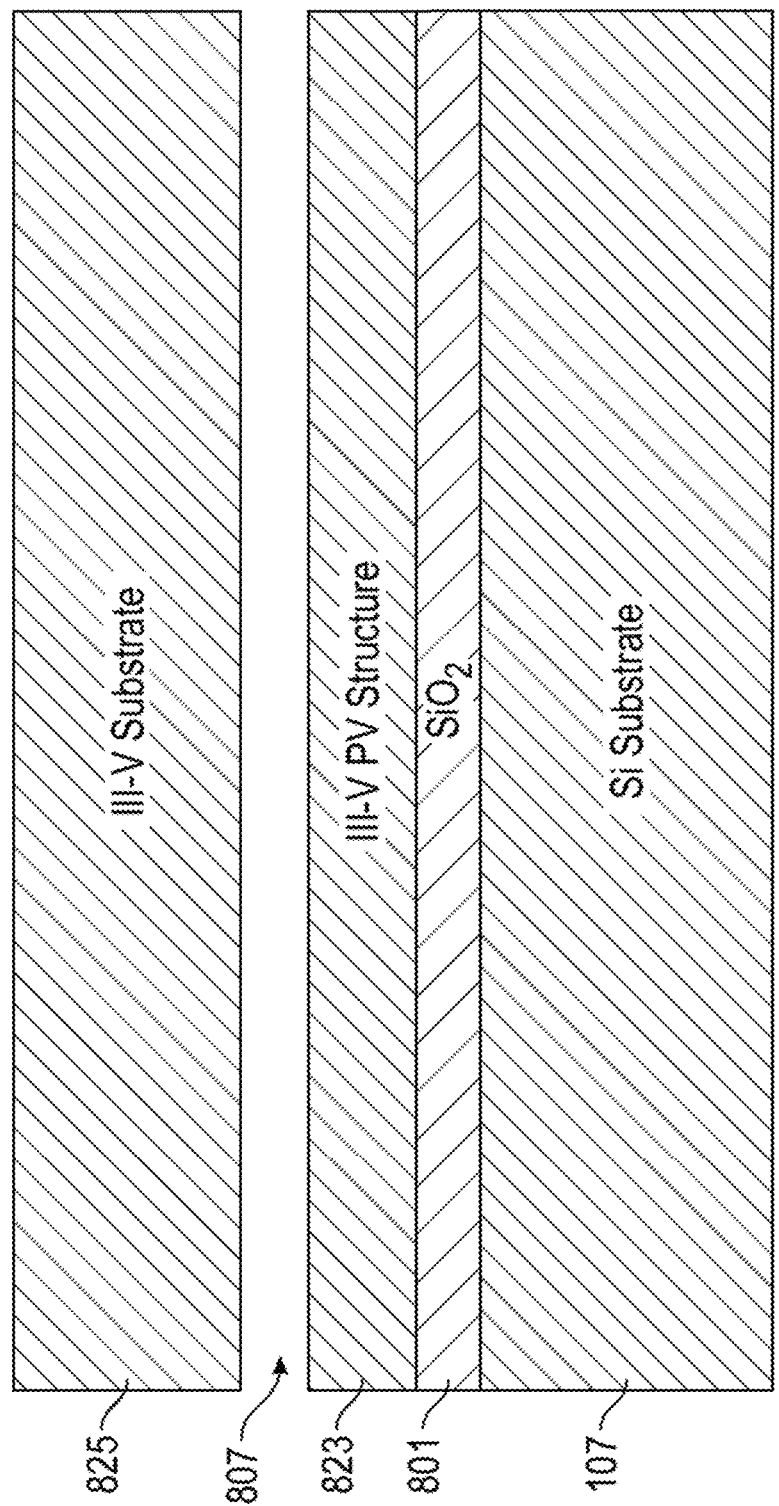
FIG. 6 show an exemplary step in the fabrication of a second semiconductor structure, according to an aspect of the invention.
Figure 12:
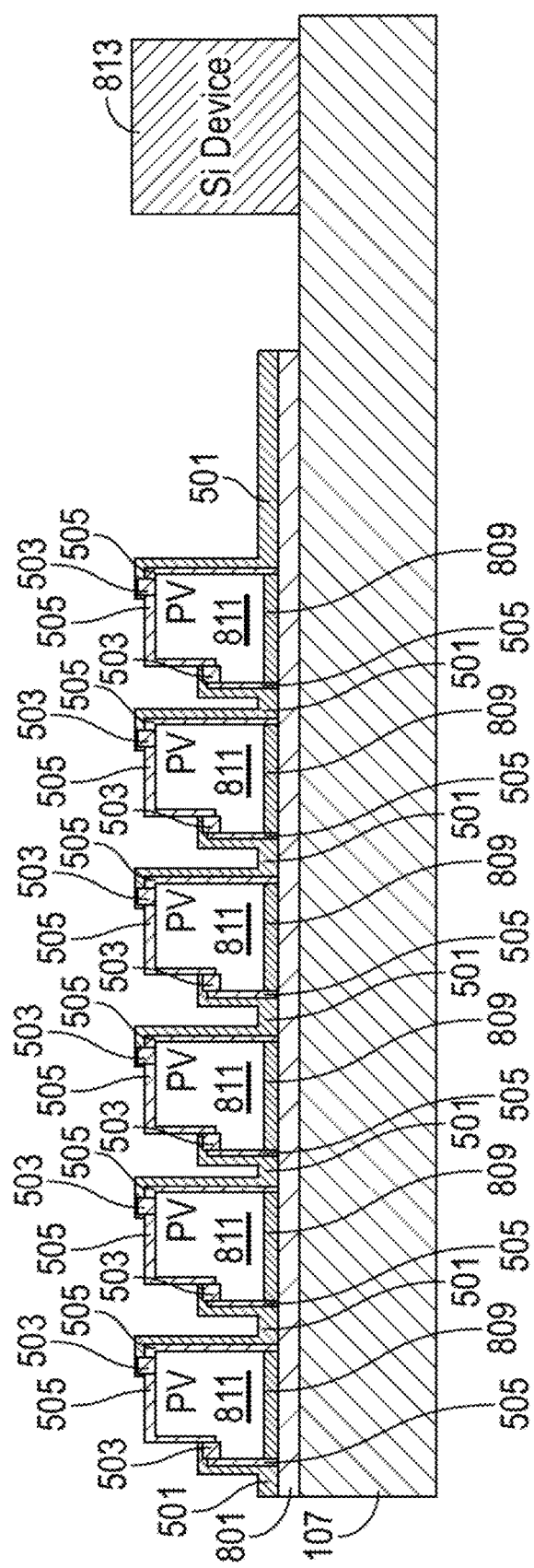
FIG. 12 shows the second semiconductor structure fabricated using the step of FIG. 6, according to an aspect of the invention.

Referring to FIG. 6, in an alternative embodiment, the III-V PV structure is bonded on the Si for off cut, using, e.g., direct wafer bonding as discussed above. In FIG. 6, layer 801 (e.g., $SiO_2$) is deposited on top of substrate 107 and provides a bonding interface to III-V photovoltaic structure (layer 823) (thickness of layer 823 can be, for example, about 3 μm). Layer release 807 outward of the layer 823 represents a suitable wafer thinning process (a cutting process such as the SmartCut process discussed above is an example), which detaches portion 825. In FIG. 6, for example, carry out such a process on the III-V material and then directly obtain the structure depicted in FIG. 6 without requiring epitaxial growth on the SOI—it is then possible to directly proceed with fabrication of the PV structures. Devices can be formed on layer 823 using conventional lithographic, etching, deposition, and metallization techniques. An exemplary final structure is depicted in FIG. 12.

Figure 7:
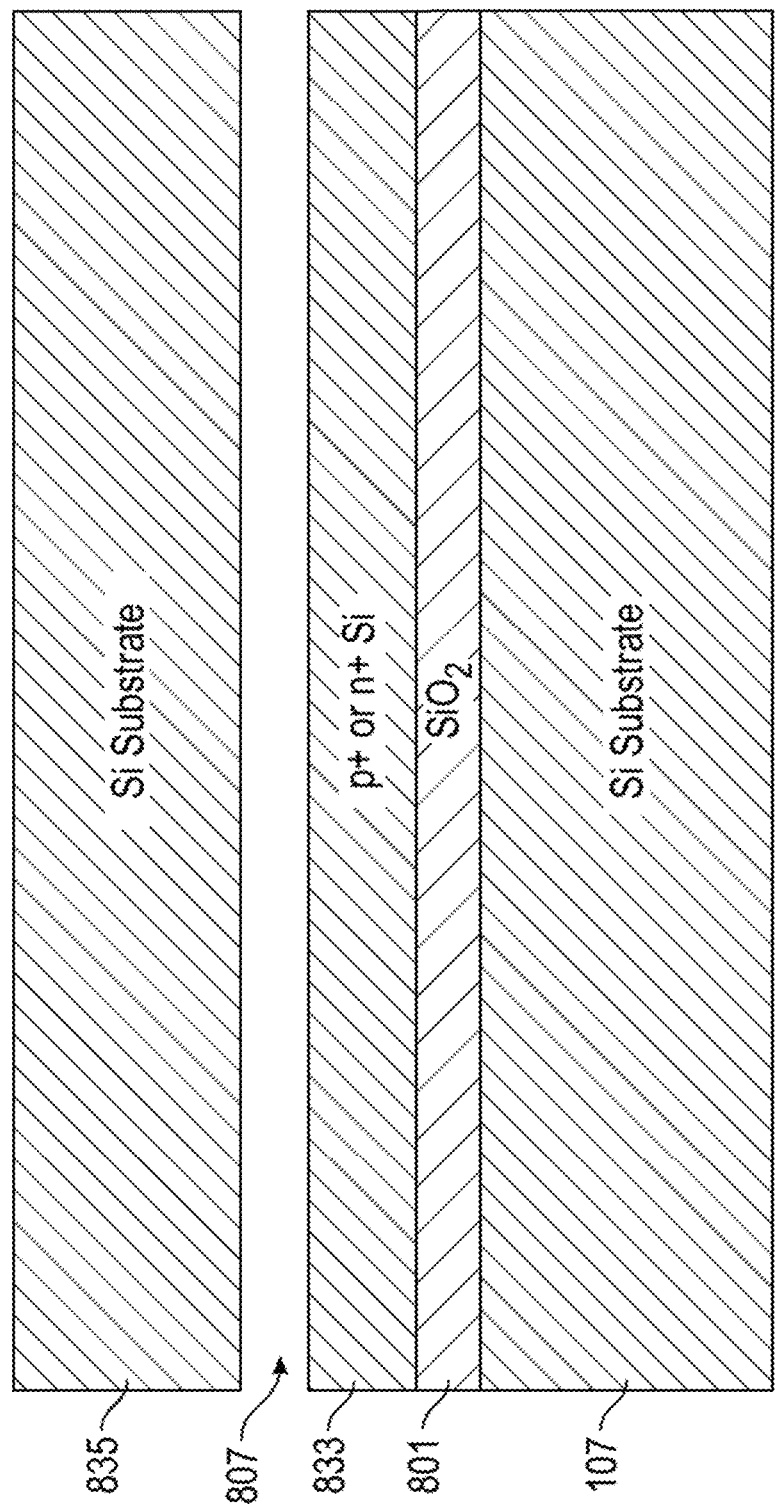
FIGS. 7 and 8 show exemplary steps in the fabrication of a third semiconductor structure, according to an aspect of the invention.
Figure 8:
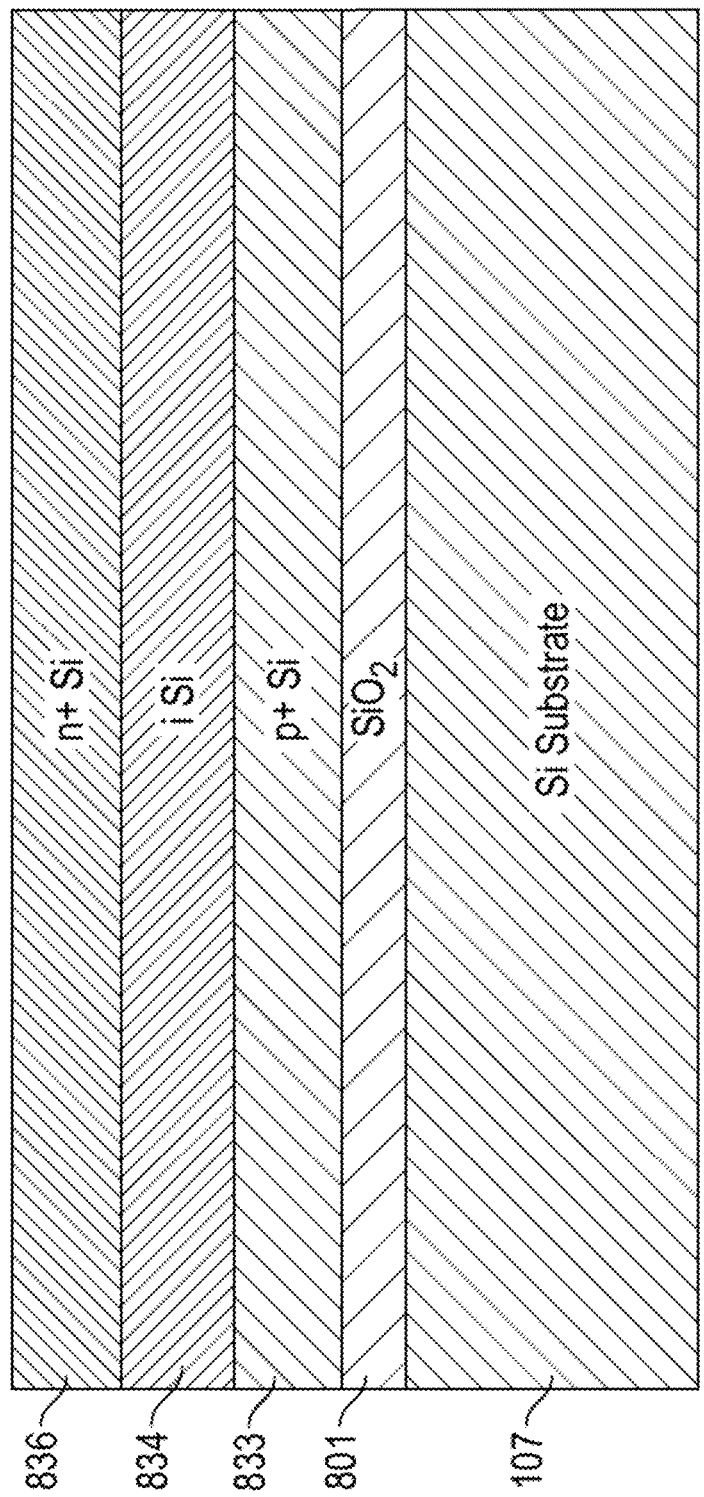
Figure 13:
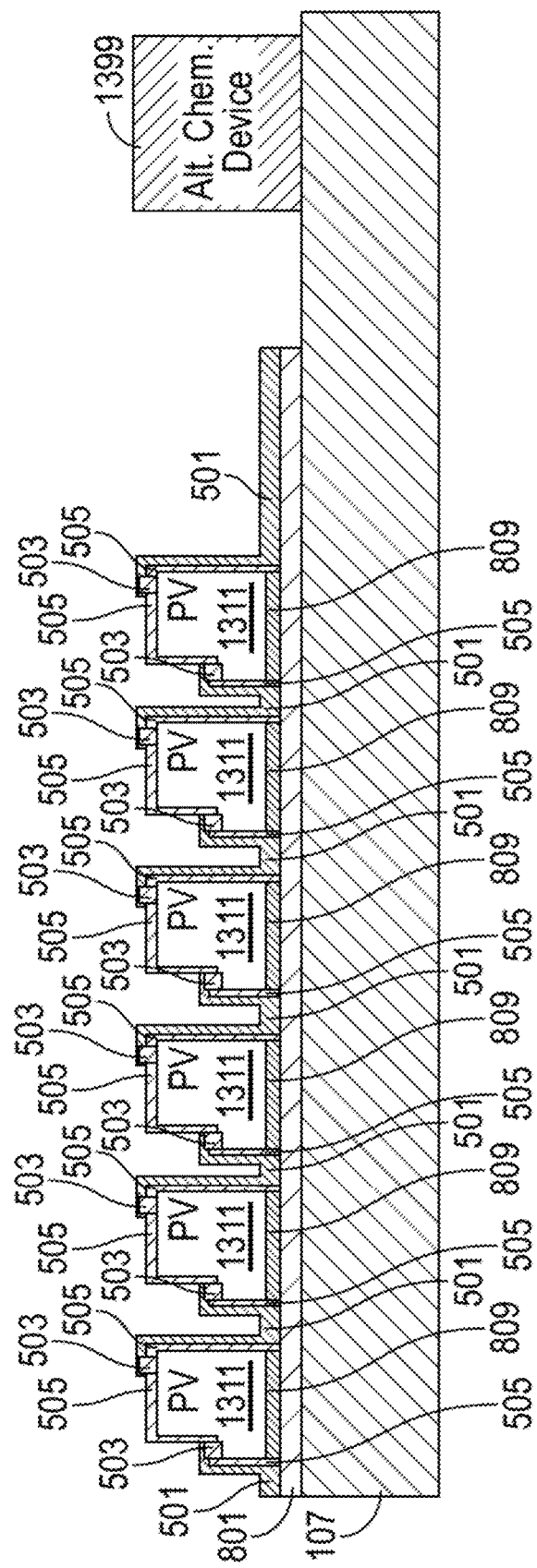
FIG. 13 shows the third semiconductor structure fabricated using the steps of FIGS. 7 and 8, according to an aspect of the invention.

Referring to FIG. 7, in another alternative embodiment, relatively thick p+ or n+ layers (typically one or the other, not both in the same layer) are provided on the SOI substrate (i.e., 801 plus 107) for Si vertical junction growth. In FIG. 7, layer 801 (e.g., $SiO_2$) is deposited on top of substrate 107 and provides a bonding interface to p+ (or n+) Si 833 (thickness of 833 can be, for example, from about 1 μm to 10 μm while thickness of 835 can be any value, selected to have adequate thickness for ease in handling as will be apparent to the skilled artisan). Layer release 807 outward of the layer 833 represents a suitable wafer thinning process (a cutting process such as the SmartCut process discussed above is an example), which detaches portion 835. A pertinent difference from the embodiments of FIG. 1 is that the embodiment of FIG. 1 employs 6 degree offcut 806 to grow III-V material while in FIG. 7, structures can be grown on Si layer 833 or layer 833 can be used as a PV layer. We have found that a thickness of 1-10 μm for layer 833 is enough to absorb a significant portion of light. In the embodiment of FIG. 7, use a different chemistry (not III-V) when growing material directly on Si 833. In the example shown in FIG. 8, a Si P-I-N (p layer 833, i layer 834, n layer 836) which can be patterned into small PV devices (see elements 1311 in FIG. 13). These layers can be grown continuously or one layer can be grown and then another layer grown later, for example. Layers 833, 834, 836 can each have a thickness of about 1-10 for example. Advantageously, the layer 801 (e.g. oxide) will provide an insulating layer so the PV devices will not short. In the embodiment of FIG. 8, the Si P-I-N 1311 (see FIG. 13) replaces the PV structures 811 in FIG. 5. Embodiments are also possible that employ some Si devices and some devices of alternative chemistry (see 1399 in FIG. 13). This can be advantageous since some materials absorb some wavelengths of light better than others. For example, in FIG. 3, build III-V devices on the off cut and etch down to the Si substrate 107 and build Si-based PV devices 813 on that. An exemplary final structure is depicted in FIG. 13.

Figure 9:
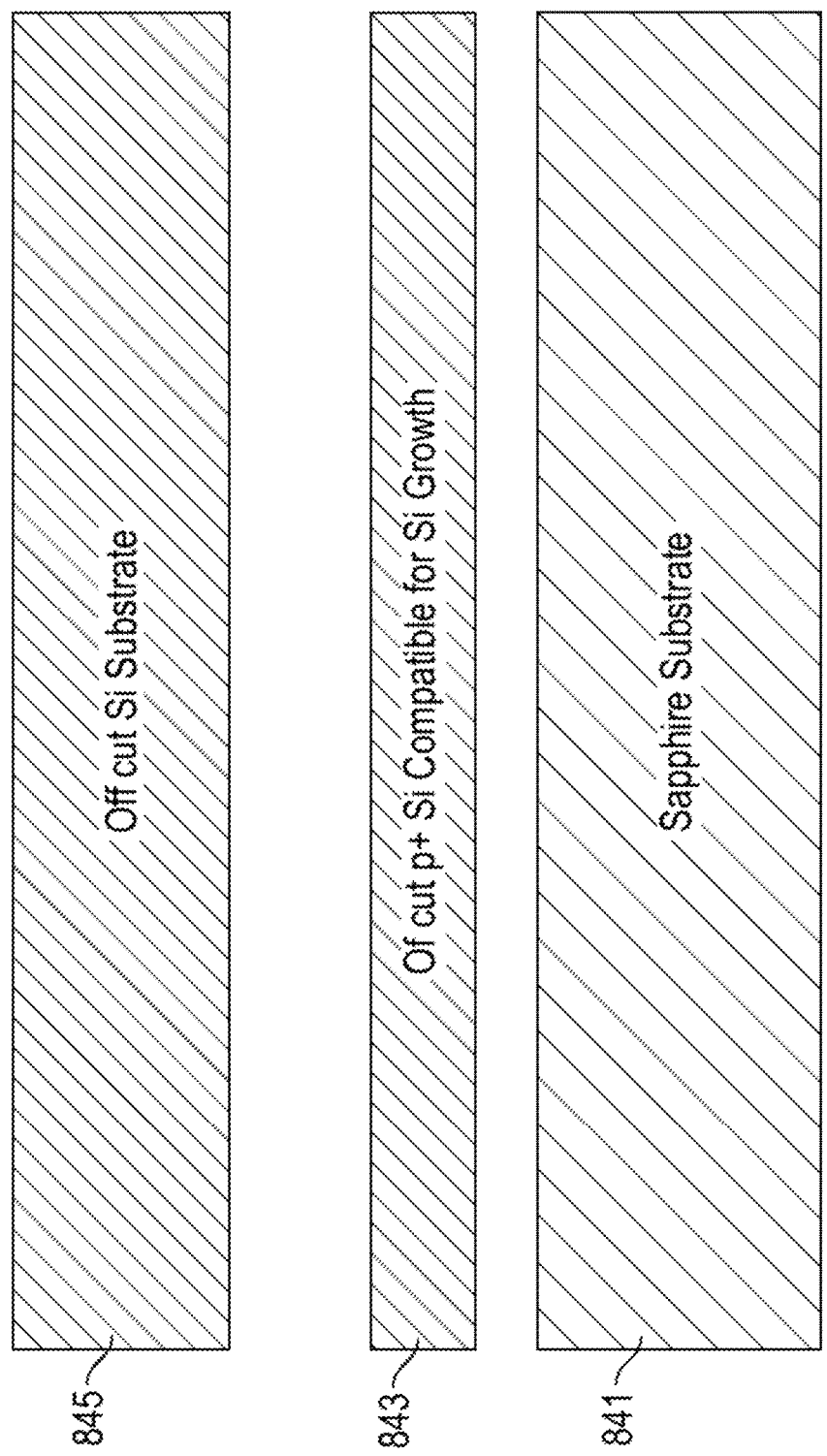
FIGS. 9 and 10 show exemplary steps in the fabrication of a fourth semiconductor structure, according to an aspect of the invention.
Figure 10:
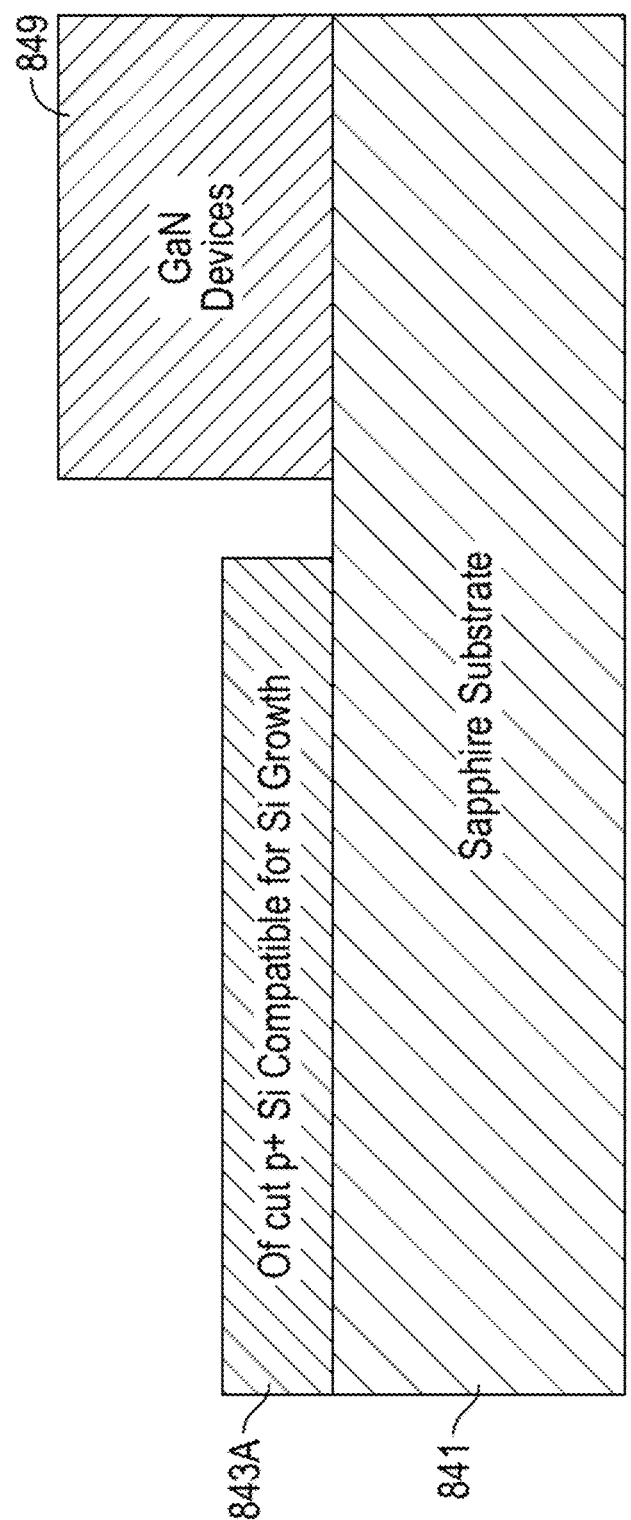
Figure 11:
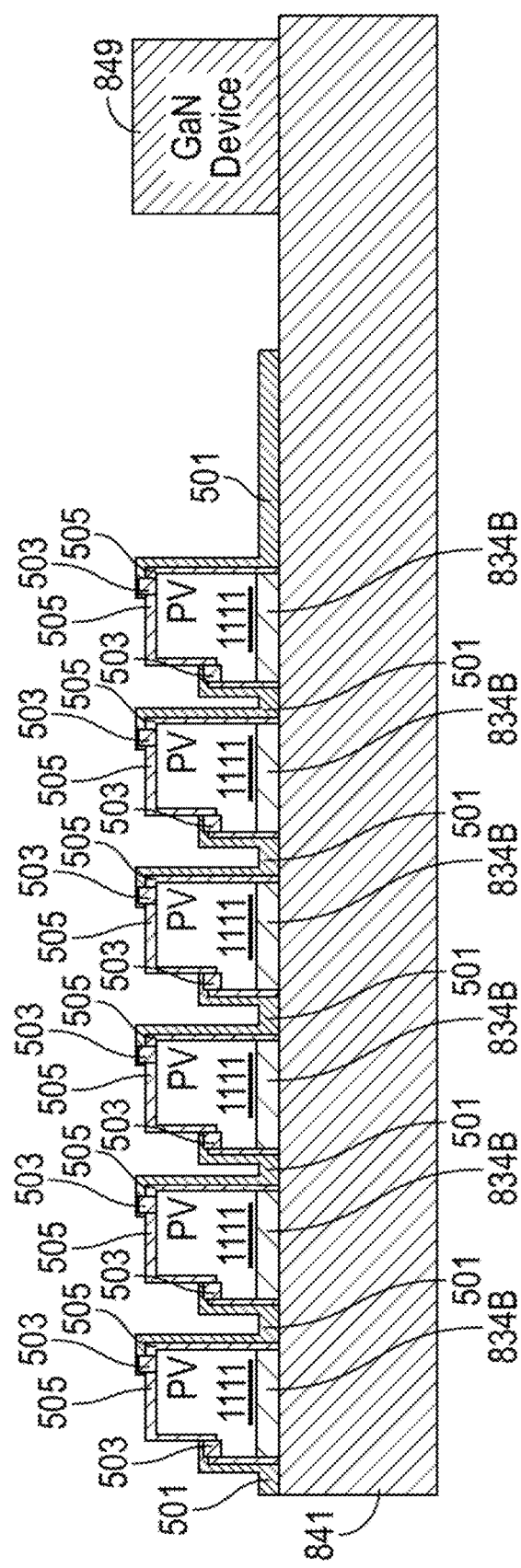
FIG. 11 shows the fourth semiconductor structure fabricated using the step of FIGS. 9 and 10, according to an aspect of the invention.

Referring to FIG. 9, in still another alternative embodiment, photovoltaics and electronics are integrated on a sapphire substrate 841. Layer 843 is bonded on the substrate 841 for off cut, using, e.g., direct wafer bonding as discussed above. Note off cut p+ Si 843 (thickness can be, for example, from about 1 μm to 10 μm) which has compatibility for Si growth. The off cut could be n+ in other embodiments, for example. Layer 845 outward of the layer 843 can be removed via a suitable wafer thinning process (a cutting process such as the SmartCut process discussed above is an example). In FIG. 10, GaN is grown directly on sapphire substrate 841 and GaN devices 849 are formed in same. The end result is shown in FIG. 11, with III-V or Si devices 1111 formed over 843B (thinned 843A). The GaN devices 849 are analogous to the Si devices 813 of FIG. 5. FIG. 9 thus depicts a portion of a fabrication process while FIG. 10 depicts a structure on which devices can be fabricated and FIG. 11 shows a final stage. GaN devices 849 can be formed on the GaN using conventional lithographic, etching, deposition, and metallization techniques.

One or more embodiments thus permit epitaxial growth and transfer of special oriented Si, Ge, or III-V layers or p-n junctions to a Si substrate for subsequent III-V and Si device epitaxy. As noted, this constitutes a technological improvement over certain techniques that require epitaxial growth on an SOI substrate, which is more complicated than on an Si substrate. One or more embodiments build offcut, highly doped, thick Si layers, or III-V layers, during the SOI wafer fabrication process (FIGS. 1-8) using epitaxy and a layer release process and/or build such wafers on a sapphire substrate for integration with Si and GaN as well (FIGS. 9 and 10).

Some embodiments of invention, such as FIGS. 1-5, use heteroepitaxy (e.g., growth on a 6 degree offcut) as opposed to regular epitaxy with a complex double-flip/bonding process required in some cases where aspects of the invention are not employed. On the other hand, some embodiments, such as that of FIG. 6, use normal epitaxy and bonding 802. That is to say, some embodiments do not employ heteroepitaxy but rather use epitaxy to produce a wafer and then use wafer bonding (for example, for special vertical junction PV cells on silicon). Indeed, one or more embodiments provide structures using vertical junction III-V and Si PV devices made by epitaxial growth and bonding. One or more embodiments enable a compatible integration process with silicon electronics and top electrodes with PV devices facing up and/or serially connected PV devices facing up, with all top electrodes and integration compatibility with silicon electronics.

Printing/solder bonding/pick and place approaches not employing aspects of the invention require flipping, such as a complicated double flip to have the original face pointed up.

With regard to the value of 6 degrees for the off cut, the same advantageously matches Germanium and GaAs. GaAs advantageously provides good versatility. Embodiments employing SOI advantageously help with integration because it is possible to directly wire with normal silicon processing; such embodiments are less complicated than approaches requiring pick and place.

Thus, in one or more embodiments, transfer a thick layer (say 1-10 μm) and form PV devices in the layer without the need for epitaxial growth.

As will be appreciated by the skilled artisan, the epitaxial deposition process may employ the deposition chamber of a chemical vapor deposition type apparatus, such as a low pressure chemical vapor deposition (LPCVD) apparatus. A number of different precursors may be used for the epitaxial deposition. In some embodiments, the gas source for the deposition of an epitaxially formed semiconductor layers may include silicon (Si) deposited from silane, disilane, trisilane, tetrasilane, hexachlorodisilane, tetrachlorosilane, dichlorosilane, trichlorosilane, disilane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. In-situ doping can be conducted using conventional precursor materials and techniques, for example silane with diborane or phosphane depending on the conductivity type required.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching." For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, and referring, for example, to FIGS. 5 and 11, it will be appreciated that, in general terms, an exemplary photovoltaic structure includes a substrate 107, 841; and a plurality of off-axis, doped silicon regions 803B, 843B, outward of the substrate. The plurality of off-axis, doped silicon regions have an off-axis lattice orientation at a predetermined non-zero (e.g., 6 degrees) angle (refer to 806, for example, which is generally applicable for all embodiments). Also included are a plurality of photovoltaic devices 811, 1111 of a first chemistry, outward of the plurality of off-axis, doped silicon regions.

In some instances, such as FIG. 5, the substrate 107 includes silicon and the photovoltaic devices of the first chemistry include III-V photovoltaic devices 811. Also included is an (oxide, e.g.) layer 801 outward of the silicon substrate. Layer 801 has an outer surface. The plurality of off-axis, doped silicon regions 803B are located outward of the oxide layer. Further included are a plurality of germanium regions 809 outward of the plurality of off-axis, doped silicon regions. The III-V photovoltaic devices are located outward of the germanium regions.

One or more such instances further include a plurality of conductive jumpers 501 electrically interconnecting the III-V photovoltaic devices 811.

In some instances, such as FIG. 11, the substrate includes sapphire 841 and the photovoltaic devices of the first chemistry (e.g., devices 1111) include at least one of III-V photovoltaic devices and silicon-based photovoltaic devices.

One or more such instances further include a plurality of conductive jumpers 501 electrically interconnecting the photovoltaic devices 1111.

Referring, for example, to FIGS. 5 and 11, it will be appreciated that one or more embodiments further include a plurality of photovoltaic devices 813, 849 of a second chemistry, different than the first chemistry, outward of the substrate 107, 841 and spaced away from the plurality of off-axis, doped silicon regions 803B, 843B.

In some instances, such as FIG. 5, the substrate 107 includes silicon, the photovoltaic devices of the first chemistry (e.g., devices 811) include III-V photovoltaic devices, and the photovoltaic devices of the second chemistry (e.g., device 813) include silicon photovoltaic devices. Also included are an (oxide, e.g.) layer 801 outward of the silicon substrate and having an outer surface. The plurality of off-axis, doped silicon regions 803B are located outward of the (oxide, e.g.) layer 801. A plurality of germanium regions 809 are located outward of the plurality of off-axis, doped silicon regions 803B. The III-V photovoltaic devices are located outward of the germanium regions.

One or more such instances further include a plurality of conductive jumpers 501 electrically interconnecting the III-V photovoltaic devices 811.

In some instances, such as FIG. 11, the substrate includes sapphire 841, the photovoltaic devices of the first chemistry 1111 include at least one of III-V photovoltaic devices and silicon-based photovoltaic devices, and the photovoltaic devices of the second chemistry include gallium nitride photovoltaic devices 849.

One or more such instances further include a plurality of conductive jumpers 501 electrically interconnecting the photovoltaic devices 1111.

Furthermore, given the discussion thus far, and referring, for example, to FIGS. 12 and 13, it will be appreciated that, in general terms, another exemplary photovoltaic structure includes a silicon substrate 107; a layer 801 (e.g., oxide such as SiO$_2$) outward of the silicon substrate and having an outer surface; and a plurality of photovoltaic devices 811, 1311 located outward of the oxide layer.

Referring to FIG. 12, in one or more such embodiments, the photovoltaic devices include III-V photovoltaic devices 811.

On the other hand, referring to FIG. 13, in one or more such embodiments, the photovoltaic devices include silicon P-I-N photovoltaic devices 1311.

In accordance with further aspects of the invention, and referring to FIGS. 1-5 and 9-11, an exemplary method of forming a photovoltaic structure includes providing a substrate 107 plus 801, or 841, having an outer surface; and direct wafer bonding, to the outer surface of the substrate, an off-axis silicon layer 803, 843, having an off-axis lattice orientation at a predetermined non-zero angle. Also included are forming a plurality of off-axis, doped silicon regions 803B, 843B in the off-axis silicon layer; and forming a plurality of photovoltaic devices of a first chemistry (e.g., devices 811, 1111) outward of the plurality of off-axis, doped silicon regions 803B/843B.

Referring specifically to FIGS. 1-5, in some instances, the method further includes forming an (oxide, e.g.) layer 801 outward of a silicon region (e.g., substrate 107) to obtain the (SOI) substrate. In the step of forming the plurality of photovoltaic devices of the first chemistry, the photovoltaic devices of the first chemistry include III-V photovoltaic devices. A further step includes forming a plurality of germanium regions 809 outward of the plurality of off-axis, doped silicon regions. The III-V photovoltaic devices are formed outward of the germanium regions.

Referring specifically to FIGS. 9-11, in some instances, in the providing step, the substrate includes sapphire 841 and, in the forming step, the photovoltaic devices of the first chemistry 1111 include at least one of III-V photovoltaic devices and silicon-based photovoltaic devices.

Referring again to FIGS. 1-5 and 9-11, in some cases, the method further includes forming a plurality of photovoltaic devices 813, 849 of a second chemistry, different than the first chemistry, outward of the substrate and spaced away from the plurality of off-axis, doped silicon regions.

Referring specifically to FIGS. 1-5, in some instances, the method further includes forming an (oxide, e.g.) layer 801 outward of a silicon region 107 to obtain the substrate. In the in the step of forming the plurality of photovoltaic devices of the first chemistry, the photovoltaic devices of the first chemistry include III-V photovoltaic devices 811. In the in the step of forming the plurality of photovoltaic devices of the second chemistry 813, the photovoltaic devices of the second chemistry include silicon photovoltaic devices. A further step includes forming a plurality of germanium regions 809 outward of the plurality of off-axis, doped silicon regions. The III-V photovoltaic devices are formed outward of the germanium regions.

Referring specifically to FIGS. 9-11, in some instances, in the providing step, the substrate includes sapphire 841, in the step of forming the plurality of photovoltaic devices of the first chemistry, the photovoltaic devices of the first chemistry 1111 include at least one of III-V photovoltaic devices and silicon-based photovoltaic devices, and in the step of forming the plurality of photovoltaic devices of the second chemistry 849, the photovoltaic devices of the second chemistry include gallium nitride photovoltaic devices.

In accordance with still further aspects of the invention, and referring to FIGS. 6 and 12 and FIGS. 7, 8, and 13, another exemplary method of forming a photovoltaic structure includes providing a silicon substrate 107; forming an (oxide, e.g.) layer 801 outward of the silicon substrate and having an outer surface; direct wafer bonding a fabrication layer 823, 833 to the oxide layer; and forming a plurality of photovoltaic devices 811, 1311 at least partially in the fabrication layer.

Referring specifically to FIGS. 6 and 12, in some instances, in the step of forming the plurality of photovoltaic devices, the photovoltaic devices include III-V photovoltaic devices 811.

Referring specifically to FIGS. 7, 8, and 13, in some instances, in the step of forming the plurality of photovoltaic devices, the photovoltaic devices include silicon P-I-N photovoltaic devices 1311.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having vertical silicon and/or III-V photovoltaics integration with silicon electronics.

An integrated circuit in accordance with aspects of the present inventions can be employed in essentially any application and/or electronic system where vertical silicon and/or III-V photovoltaics integration with silicon electronics would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A photovoltaic structure comprising:
   a substrate;
   a plurality of off-axis, doped silicon regions outward of the substrate, the plurality of off-axis, doped silicon regions having an off-axis lattice orientation at a predetermined non-zero angle; and
   a plurality of photovoltaic devices of a first chemistry, outward of the plurality of off-axis, doped silicon regions.

2. The photovoltaic structure of claim 1, wherein the substrate comprises silicon and the plurality of photovoltaic devices of the first chemistry comprise III-V photovoltaic devices, further comprising:
   an oxide layer outward of the silicon substrate and having an outer surface, the plurality of off-axis, doped silicon regions being located outward of the oxide layer;
   a plurality of germanium regions outward of the plurality of off-axis, doped silicon regions, the III-V photovoltaic devices being located outward of the germanium regions.

3. The photovoltaic structure of claim 2, further comprising a plurality of conductive jumpers electrically interconnecting the III-V photovoltaic devices.

4. The photovoltaic structure of claim 1, wherein the substrate comprises sapphire and the plurality of photovoltaic devices of the first chemistry comprise at least one of III-V photovoltaic devices and silicon-based photovoltaic devices.

5. The photovoltaic structure of claim 4, further comprising a plurality of conductive jumpers electrically interconnecting the photovoltaic devices.

6. The photovoltaic structure of claim 1, further comprising a plurality of photovoltaic devices of a second chemistry, different than the first chemistry, outward of the substrate and spaced away from the plurality of off-axis, doped silicon regions.

7. The photovoltaic structure of claim 6, wherein the substrate comprises silicon, the photovoltaic devices of the first chemistry comprise III-V photovoltaic devices, and the plurality of photovoltaic devices of the second chemistry comprise silicon photovoltaic devices further comprising:
   an oxide layer outward of the silicon substrate and having an outer surface, the plurality of off-axis, doped silicon regions being located outward of the oxide layer;
   a plurality of germanium regions outward of the plurality of off-axis, doped silicon regions, the III-V photovoltaic devices being located outward of the germanium regions.

8. The photovoltaic structure of claim 6, wherein the substrate comprises sapphire, the photovoltaic devices of the first chemistry comprise at least one of III-V photovoltaic devices and silicon-based photovoltaic devices, and the photovoltaic devices of the second chemistry comprise gallium nitride photovoltaic devices.

9. The photovoltaic structure of claim 1, wherein the predetermined non-zero angle is 6 degrees.

10. A method of forming a photovoltaic structure, comprising:
    providing a substrate having an outer surface;
    direct wafer bonding, to the outer surface of the substrate, an off-axis silicon layer, having an off-axis lattice orientation at a predetermined non-zero angle;
    forming a plurality of off-axis, doped silicon regions in the off-axis silicon layer; and
    forming a plurality of photovoltaic devices of a first chemistry outward of the plurality of off-axis, doped silicon regions.

11. The method of claim 10, further comprising forming an oxide layer outward of a silicon region to obtain the substrate, wherein, in the step of forming the plurality of photovoltaic devices of the first chemistry, the plurality of photovoltaic devices of the first chemistry comprise III-V photovoltaic devices, further comprising forming a plurality of germanium regions outward of the plurality of off-axis, doped silicon regions, the III-V photovoltaic devices being formed outward of the germanium regions.

12. The method of claim 11, wherein, in the providing step, the substrate comprises sapphire and wherein, in the forming step, the photovoltaic devices of the first chemistry comprise at least one of III-V photovoltaic devices and silicon-based photovoltaic devices.

13. The method of claim 10, further comprising forming a plurality of photovoltaic devices of a second chemistry, different than the first chemistry, outward of the substrate and spaced away from the plurality of off-axis, doped silicon regions.

14. The method of claim 13, further comprising forming an oxide layer outward of a silicon region to obtain the substrate, wherein, in the step of forming the plurality of photovoltaic devices of the first chemistry, the photovoltaic devices of the first chemistry comprise III-V photovoltaic devices, and wherein, in the in the step of forming the plurality of photovoltaic devices of the second chemistry, the plurality of photovoltaic devices of the second chemistry comprise silicon photovoltaic devices, further comprising forming a plurality of germanium regions outward of the plurality of off-axis, doped silicon regions, the III-V photovoltaic devices being formed outward of the germanium regions.

15. The method of claim 13, wherein, in the providing step, the substrate comprises sapphire, wherein, in the step of forming the plurality of photovoltaic devices of the first chemistry, the plurality of photovoltaic devices of the first chemistry comprise at least one of III-V photovoltaic devices and silicon-based photovoltaic devices, and wherein, in the step of forming the plurality of photovoltaic devices of the second chemistry, the plurality of photovoltaic devices of the second chemistry comprise gallium nitride photovoltaic devices.

16. The method of claim 10, wherein, in the direct wafer bonding step, the predetermined non-zero angle is 6 degrees.

* * * * *